United States Patent
Kawabe et al.

(10) Patent No.: US 6,808,670 B2
(45) Date of Patent: Oct. 26, 2004

(54) PROCESS FOR MANUFACTURING INORGANIC ARTICLE

(75) Inventors: Masaaki Kawabe, Ibaraki (JP); Takashi Tarao, Ibaraki (JP); Kouji Kimura, Ibaraki (JP)

(73) Assignee: Japan Vilene Co., Ltd., Tokyo (JP)

( * ) Notice: Subject to any disclaimer, the term of this patent is extended or adjusted under 35 U.S.C. 154(b) by 118 days.

(21) Appl. No.: 10/163,997

(22) Filed: Jun. 7, 2002

(65) Prior Publication Data

US 2003/0005723 A1 Jan. 9, 2003

(30) Foreign Application Priority Data

| Jun. 8, 2001 | (JP) | ............................ 2001-174898 |
| Jun. 22, 2001 | (JP) | ............................ 2001-189092 |
| Dec. 18, 2001 | (JP) | ............................ 2001-385268 |

(51) Int. Cl.$^7$ ............................................... H05B 6/00
(52) U.S. Cl. .................................... 264/433; 264/623
(58) Field of Search .................................. 264/433, 623

(56) References Cited

U.S. PATENT DOCUMENTS

| 4,180,409 A | 12/1979 | Mansmann |
| 4,547,421 A | 10/1985 | Dunbar |
| 5,272,240 A | * 12/1993 | Haruvy et al. ................. 528/10 |
| 5,322,752 A | * 6/1994 | Gay ............................. 430/37 |
| 5,603,819 A | 2/1997 | Harris et al. |

FOREIGN PATENT DOCUMENTS

| WO | WO 92/09541 A1 | 6/1992 |

OTHER PUBLICATIONS

Database WPI Section Ch, Week 199244 Derwent Publications ltd., London, GB; AN 1992–361813 XP002210060 & JP 04 263695 A (Mitsubishi Paper Mills Ltd), Sep. 18, 1992 abstract.

* cited by examiner

*Primary Examiner*—Christopher A. Fiorilla
(74) *Attorney, Agent, or Firm*—Sughrue Mion, PLLC (57) ABSTRACT

A process for manufacturing an inorganic material-based article comprising the steps of (1) forming a sol solution mainly composed of an inorganic component, (2) producing inorganic material-based gel fine fibers by extruding the resulting sol solution from a nozzle, and at the same time, applying an electrical field to the extruded sol solution to thin the extruded sol solution, and then, collecting inorganic material-based gel fine fibers on a support, (3) drying the collected inorganic material-based gel fine fibers to produce inorganic material-based article containing inorganic material-based dried gel fine fibers, and then, (4) sintering the inorganic material-based article containing inorganic material-based dried gel fine fibers to produce inorganic material-based article containing inorganic material-based sintered fine fibers.

6 Claims, 1 Drawing Sheet

Fig. 1

PROCESS FOR MANUFACTURING INORGANIC ARTICLE

BACKGROUND OF THE INVENTION

1. Field of the Invention

The present invention relates to a process for manufacturing an inorganic material-based article consisting of or composed mainly of inorganic material-based fine fibers, and an inorganic material-based article which may be prepared by the above-mentioned process and consists of or is composed mainly of inorganic material-based ultra-fine long fibers.

2. Description of the Related Art

For example, an inorganic material-based sheet composed of inorganic material-based short fibers, such as glass short fibers, is favorably used as a filter or a separator in a lead accumulator, because of excellent filtering and separating properties.

The inorganic material-based short-fibers sheet was prepared, for example, by forming a sheet from material-based short-fibers in accordance with a wed-laid method. There is a possibility that some inorganic material-based short-fibers are dropped from the inorganic material-based short-fibers sheet prepared by the above-mentioned process. Therefore, it is preferable to bond inorganic material-based short-fibers by an adhesive. When the adhesive is used, however, there were disadvantages in that the adhesive is eluted, or applications of the inorganic material-based short-fibers sheet was limited.

For example, Sumio Sakka, "Zoru-Geru Hou no Kagaku (Science of a sol-gel method)" published by Agune-Shofu, Jul. 5, 1988, discloses that short fibers having a diameter of 10 μm and a length of at most 20 mm can be prepared (pages 78–79). Nevertheless, there is a possibility that some short fibers are dropped from a fiber sheet prepared from such short fibers, because of shortness, and if an adhesive is used, there were disadvantages in that the adhesive is eluted, or applications of the inorganic material-based short-fibers sheet was limited.

For example, when the inorganic material-based short-fibers sheet is used as a filter in a clean room, eluted substances may be adhered to a surface of a silicon wafer or a glass substrate. In some cases, the inorganic material-based short-fibers sheet cannot be used as a heat-resistant filter, because an adhesive is not heat-resistant.

Furthermore, the inorganic material-based short-fibers in prior art have a large diameter, and do not have pliability. Therefore, a shape of the article of the inorganic material-based short-fibers is limited to a sheet or a plate, and the application is also limited.

Recently, miniaturization and high performance of a semiconductor or an electronic component such as a circuit board mounted on a computer is desired due to the miniaturization and high performance of industrial or personal electronic equipment. For the miniaturization of the electronic component, it is important to thin the circuit board and to make wiring denser. Therefore, the material for the circuit board is required to have a reliable insulation quality enabling a thinning of line pitches, and a laser workability enabling the miniaturization of holes.

Hitherto, a glass-epoxy circuit board prepared by impregnating a substrate of a glass fibers woven fabric or a glass fibers nonwoven fabric with an epoxy resin was widely used as a circuit board carrying electronic components.

Nevertheless, the glass-epoxy circuit board has disadvantages that, when holes are produced by a laser, a shape of the produced hole may not be accurate, or a fuzzing may occur.

Recently, a circuit board of organic fibers such as an aramid fiber attracted attention because of an excellent resistance to thermal expansion and a laser workability. Nevertheless, an aramide fiber has a high hygroscopity, and disadvantageously, the circuit board lacks reliable insulation quality.

SUMMARY OF THE INVENTION

Accordingly, the object of the present invention is to remedy the disadvantages in prior art and provide a process for manufacturing an inorganic material-based article which can avoid an adhesive and remedy the disadvantages caused by the adhesive used in prior art.

Another object of the present invention is to provide an inorganic material-based article having an excellent pliability from which fibers are hardly dropped, or pollutants derived from an adhesive are hardly released.

Still another object of the present invention is to provide a circuit board having an excellent reliable insulation quality and a laser workability, and sufficiently meeting the recent requirement for the miniaturization and high performance.

Still another object of the present invention is to provide a substrate for the circuit board.

Other objects and advantages of the present invention will be apparent from the following description.

In accordance with the present invention, there is provided a process for manufacturing an inorganic material-based article comprising the steps of (1) forming a sol solution mainly composed of an inorganic component [hereinafter sometimes referred to a sol solution forming step], (2) producing inorganic material-based gel fine fibers by extruding the resulting sol solution from a nozzle, and at the same time, applying an electrical field to the extruded sol solution to thin the extruded sol solution, and then, collecting inorganic material-based gel fine fibers on a support [hereinafter sometimes referred to a collecting step], and then, (3) drying the collected inorganic material-based gel fine fibers to produce inorganic material-based article containing inorganic material-based dried gel fine fibers [hereinafter sometimes referred to a drying step], and/or (4) sintering the collected inorganic material-based gel fine fibers or the inorganic material-based article containing inorganic material-based dried gel fine fibers to produce inorganic material-based article containing inorganic material-based sintered fine fibers [hereinafter sometimes referred to a sintering step].

According to the manufacturing process of the present invention, the inorganic material-based article can be prepared by the drying and/or sintering without an adhesive, and therefore, the disadvantages caused by the adhesive can be avoided.

According to a preferable embodiment of the manufacturing process of the present invention, the support used in the collecting step (2) has a three-dimensional structure. The resulting inorganic material-based article has a three-dimensional structure, and can be applied to various fields.

In accordance with the present invention, there is also provided an inorganic material-based article comprising inorganic material-based ultra-fine long fibers having an average fiber diameter of 2 μm or less, and composed mainly of an inorganic component.

As above, the inorganic material-based article according to the present invention comprises long fibers, and thus the fibers are hardly dropped therefrom. Further, a diameter of the fiber is as small as 2 μm or less, and the article has an excellent pliability, may have various shapes, and can be applied to various fields.

According to a preferable embodiment of the inorganic material-based article, contacting surfaces of the inorganic material-based ultra-fine long fibers are bonded to each other not via an adhesive, i.e., without an adhesive. In a preferable embodiment, the inorganic material-based article does not substantially contain an adhesive. Therefore, the article will hardly release pollutants.

According to another preferable embodiment of the inorganic material-based article, a CV value of the inorganic material-based ultra-fine long fiber in the inorganic material-based article is 0.8 or less. The inorganic material-based article composed of the inorganic material-based ultra-fine long fibers having a CV value of 0.8 or less has uniform properties.

In accordance with the present invention, there is also provided a substrate for a circuit board, comprising a fiber sheet containing inorganic material-based ultra-fine fibers having an average fiber diameter of 2 μm or less, and composed mainly of an inorganic component.

A glass fiber in a glass woven fabric or a glass nonwoven fabric used in a conventional substrate for a circuit board has a thick diameter, in view of stability upon spinning or workability. The lower limitation is as large as about 5 μm. Therefore, when a laser processing is carried out, the shape of the hole cannot be accurately controlled, or fuzzing may occur. On the contrary, the present substrate for a circuit board is formed from the inorganic material-based ultra-fine fibers having an average fiber diameter of 2 μm or less, and thus a laser processing can be carried out without encountering the problems of the control of the shape of the hole or fuzzing. The present substrate provides workability as a substrate made of organic fibers in a laser processing. Further, the inorganic material-based ultra-fine fibers are composed mainly of the inorganic component, and the present substrate for a circuit board has a highly reliable insulation quality.

According to a preferable embodiment of the present substrate for a circuit board, a silica component contained in the material-based ultra-fine fiber is 50 mass % or more. Therefore, various glass compositions from, for example, a conventional E glass composition to a conventional Q glass (silica glass) composition may be selected dependently of various applications of the circuit board. Particularly, when the silica glass composition is used, a circuit board having a dielectric constant suitable for a high-frequency and a low dielectric dissipation factor can be manufactured.

According to another preferable embodiment of the present substrate for a circuit board, the fiber sheet has a structure of a nonwoven fabric. A structure of a glass woven fabric inevitably includes crossing portions of glass yarns. The crossing portions affect smoothness. Further, an apparent density is high, and a matrix resin is difficult to penetrate. On the contrary, the present substrate for a circuit board has the structure of a nonwoven fabric, and thus has an excellent smoothness and an excellent permeability of a resin.

According to still another preferable embodiment of the present substrate for a circuit board, the fiber sheet consists essentially of the inorganic material-based ultra-fine fibers, that is, does not substantially contain any component other than the inorganic material-based ultra-fine fibers. A conventional glass nonwoven fabric contains an adhesive, and a formation of a coating of the resin causes a poor penetration of a matrix resin into a substrate for a circuit board. On the contrary, the present substrate for a circuit board can provide a good penetration, and does not elute pollutants from an adhesive. Therefore, a circuit board having an excellent insulating property can be manufactured.

According to still another preferable embodiment of the present substrate for a circuit board, the inorganic material-based ultra-fine fibers consist essentially of long fibers. Therefore, the fuzzing may be reduced in a step of impregnating with a matrix resin or a step of processing a circuit board.

According to still another preferable embodiment of the present substrate for a circuit board, a thickness of the substrate is 80 μm or less. Therefore, a thickness of a circuit board can be lowered, and the miniaturization of a space for a circuit board can be realized.

In accordance with the present invention, there is also provided a circuit board containing the above-mentioned substrate. The present circuit board has excellent properties as mentioned above.

DESCRIPTION OF THE PREFERRED ENBODIMENTS

In the manufacturing process according to the present invention, the sol solution forming step (1) is carried out at first. That is, the sol solution composed mainly of an inorganic component is formed. The expression "composed mainly of an inorganic component" as used herein means that the inorganic component is contained at an amount of 50 mass % or more. An amount of the inorganic component in the sol solution is preferably 60 mass % or more, more preferably 75 mass % or more.

The sol solution may be prepared by hydrolysis, at about 100° C. or less, of a solution (stock solution) of a compound containing one or more elements to be included in the inorganic material-based dried gel fine fibers or the inorganic material-based sintered fine fibers forming the inorganic material-based article finally manufactured by the process according to the present invention, and then condensation polymerization. A solvent of the solution may be an organic solvent such as alcohol, or water.

The element contained in the compound is not particularly limited, but for example, lithium, beryllium, boron, carbon, sodium, magnesium, aluminum, silicon, phosphorus, sulfur, potassium, calcium, scandium, titanium, vanadium, chromium, manganese, iron, cobalt, nickel, copper, zinc, gallium, germanium, arsenic, selenium, rubidium, strontium, yttrium, zirconium, niobium, molybdenum, cadmium, indium, tin, antimony, tellurium, cesium, barium, lanthanum, hafnium, tantalum, tungsten, mercury, thallium, lead, bismuth, cerium, praseodymium, neodymium, promethium, samarium, europium, gadolinium, terbium, dysprosium, holmium, erbium, thulium, ytterbium or lutetium.

The compound containing one or more the above-mentioned elements may be an oxide of the element, for example, $SiO_2$, $Al_2O_3$, $B_2O_3$, $TiO_2$, $ZrO_2$, $CeO_2$, $FeO$, $Fe_3O_4$, $Fe_2O_3$, $VO_2$, $V_2O_5$, $SnO_2$, $CdO$, $LiO_2$, $WO_3$, $Nb_2O_5$, $Ta_2O_3$, $In_2O_3$, $GeO_2$, $PbTi_4O_9$, $LiNbO_3$, $BaTiO_3$, $PbZrO_3$, $KTaO_3$, $Li_2B_4O_7$, $NiFe_2O_4$, $SrTiO_3$. The inorganic component may be composed of one or more oxides as above, for example, two components such as $SiO_2$—$Al_2O_3$.

The sol solution may be obtained from the stock solution by condensation polymerization of the above-mentioned compounds, and is composed mainly of an inorganic material. That is, the inorganic components account for 50 mass % or more, preferably 60 mass % or more, more preferably 75 mass % or more. The sol solution must have a viscosity so that the sol solution can be spun from a nozzle in the collecting step (2) as mentioned below. The viscosity is not particularly limited, so long as the sol solution can be spun, but preferably 0.1 to 100 poise, more preferably 0.5 to 20 poise, particularly preferable 1 to 10 poise, most preferably 1 to 5 poise. If the viscosity is more than 100 poise, it becomes difficult to obtain fine fibers. If the viscosity is less than 0.1 poise, a fiber shape cannot be obtained. When a gas of a solvent same as or similar to that of the stock solution is provided around a tip of a nozzle, the sol solution having a viscosity of more than 100 poise may be used.

In addition to the inorganic components, the sol solution used in the process of the present invention may contain organic components, for example, a silane coupling agent, an organic low-molecular compound such as a dyestuff, an organic high-molecular compound such as polymethyl methacrylate. More particularly, when the compound contained in the stock solution is a silane compound, the sol solution may contain a product obtained by condensation polymerization of a silane compound modified with methyl or epoxy groups.

The stock solution may contain a solvent, for example, an organic solvent such as alcohol such as ethanol, or dimethylformamide (DMF), or water, for stabilizing the compound in the stock solution; water for hydrolyzing the compound in the stock solution; a catalyst, such as hydrochloric acid or nitric acid, for smoothly carry out hydrolysis; a chelating agent for stabilizing the compound such as a metallic compound in the stock solution; a silane coupling agent for stabilizing a compound; a compound for imparting various properties such as a piezoelectricity; an organic compound, such as polymethyl methacrylate, for improving adherence or pliability, or adjusting rigidity; or an additive such as a dyestuff. The above-mentioned additives may be added to the stock solution before, during or after the hydrolysis.

When tetraethoxy silane is used, spinning becomes difficult from a sol solution containing water at an amount (molar ratio) more four times that of alkoxide. Therefore, water is contained at an amount not more than four times that of alkoxide. Further, when a base is used as a catalyst, it becomes difficult to obtain a sol solution which may be spun. Therefore, it is preferable to use a catalyst other than a base. A reaction temperature of the sol solution forming step (1) is not particularly limited, so long as it is less than a boiling point of the solvent. When a reaction temperature is low, a reaction rate is appropriately lowered, and it becomes easier to prepare a sol solution which can be easily spun. Nevertheless, if the reaction temperature is too low, the reaction becomes difficult to proceed. The reaction temperature is preferably 10° C. or more.

In the manufacturing process according to the present invention, the collecting step (2) is then carried out. That is, inorganic material-based gel fine fibers are produced by extruding the resulting sol solution from a nozzle, and at the same time, applying an electrical field to the extruded sol solution to thin the extruded sol solution, and then, inorganic material-based gel fine fibers are collected on a support.

A diameter of the nozzle to extrude the sol solution may vary with the fiber diameter of the desired inorganic material-based dried gel fine fibers or the desired inorganic material-based sintered fine fibers. For example, the fiber diameter of the inorganic material-based dried gel fine fibers or the inorganic material-based sintered fine fibers is 2 $\mu$m or less, the diameter of the nozzle is preferably 0.1 to 3 mm.

The nozzle may be of metallic or non-metallic. When the metallic nozzle is used, the nozzle may be used as one of electrodes. When the non-metallic nozzle is used, an electrode is placed in the nozzle to apply an electric field to the extruded sol solution.

After extruding the sol solution from the nozzle, an electric field is applied to the extruded sol solution to thereby stretch and thin the solution, and produce the inorganic material-based gel fine fibers. The electric field may vary with a fiber diameter of the desired inorganic material-based dried gel fine fibers or the desired inorganic material-based sintered fine fibers, a distance between the nozzle and a support, a solvent of the stock solution, a viscosity of the sol solution, or the like, and thus is not particularly limited. For example, however, when the fiber diameter of the inorganic material-based dried gel fine fibers or the inorganic material-based sintered fine fibers is about 3 $\mu$m or less, the electric field is preferably 0.5 to 5 kV/cm. When the electric field applied is larger, the inorganic material-based gel fine fibers having thinner fiber diameter can be obtained in accordance with the increase of the electric field. Nevertheless, if the electric field applied is more than 5 kV/cm, a dielectric breakdown may easily occur. If the electric field applied is less than 0.5 kV/cm, a fiber shape may not be formed.

It is assumed that when the electric field is applied, an electrostatic charges are accumulated in the sol solution, and the sol solution is electrically drawn to an electrode placed on the side of the support whereby the sol solution is stretched and thinned to produce inorganic material-based gel fine fibers. In particular, because the sol solution is electrically drawn, a drawing speed of the sol solution is accelerated by the electric field, as the sol solution is brought close to the support, whereby the gel fiber having a thin diameter is produced. Further, an evaporation of the solvent also accelerates the thinning, and elevates an electrostatic density. The elevated density produces an electric repulsion which causes division of the fibers, whereby the fibers are further thinned. The present invention is not limited by no means to the above assumption.

The electric field may be applied between, for example, the nozzle (the metallic nozzle per se or the electrode located in the non-metallic nozzle) and the support by producing a potential difference therebetween. For example, the potential difference may be produced by applying a voltage to the nozzle and grounding the support, or applying a voltage to the support and grounding the nozzle.

The inorganic material-based gel fine fibers thinned by applying the electric field are collected on the support. The support may be a mere carrier on which the fibers are mounted, or a component carrier with which the inorganic material-based gel fine fibers are integrated. The mere support may be a porous roll or a non-porous roll. The support which may be used as the mere carrier or the component carrier is, for example, a woven fabric, a knitted fabric, a nonwoven fabric, a porous film sheet, or a non-porous sheet, such as a film. The component support may be made of fibers, such as organic fibers or inorganic fibers, or thread. The support may have any shape, such as a plane structure or a three-dimensional structure. The "three-dimensional structure" means a structure other than that of a plane sheet, and is for example, a three-dimensionally shaped article prepared by incurvating and/or bending a plane sheet. Such a three-dimensional support may be applied to various fields. For example, a bellows-like support prepared by bending a plane sheet may be favorably used in a manufacture of a filter. A cylindrical support may be favorably used in a manufacture of a liquid filter, or a bowl-like support may be favorably used in a manufacture of a mask.

The support is preferably made of a conductive material, such as a metal, having a volume resistance of $10^9$ Ω or less, when used as one of the electrodes. When a conductive material as an opposite electrode is located on the reverse side of the support with respect to the nozzle side, the support is not necessarily conductive. In the latter case, the support may be brought into contact with or separated from the conductive material.

Before the inorganic material-based gel fine fibers extruded from the nozzle and thinned by the applied electric field arrive at the support, organic fibers or yarns, inorganic fibers or yarns, or powder material may be sprayed to the inorganic material-based gel fine fibers by an air gun or the like. In this case, a mixture of the inorganic material-based gel fine fibers and the sprayed fibers and/or powder material may be collected on the support. The fibers and/or powder material may be sprayed from any direction to the inorganic material-based gel fine fibers. For example, the direction of spraying the fibers and/or powder material may be perpendicular or oblique to the direction of the inorganic material-based gel fine fibers forwarding the support from the nozzle.

The powder material may be, for example, an inorganic powder material, such as titanium dioxide, manganese dioxide, copper oxide, silicon dioxide, activated carbon, or a metal such as platinum, or an organic powder material, such as an ion-exchange resin, a colorant, a pigment, or a medicament. An average particle size of the powder material is not particularly limited, but is preferably 0.01 to 100 μm, more preferably 0.05 to 10 μm. A catalyst function, an abrasive function, an adsorption function, or an ion-exchange function can be imparted by adding the powder material.

The direction of extruding the sol solution from the nozzle generally conforms to that of collecting the inorganic material-based thinned gel fine fibers on the support. The directions are not particularly limited. For example, the inorganic material-based gel fine fibers may be substantially vertically moved from an upper nozzle to a lower support, or from a lower nozzle to an upper support. Further, the inorganic material-based gel fine fibers may be substantially horizontally extruded and moved. It is preferable that the direction for extruding the sol solution does not conform to the gravitationally effective direction so as to prevent the gel from dropping. In particular, it is more preferable that the sol solution is extruded to a direction opposite to or perpendicular to the gravitationally effective direction.

As above, the inorganic material-based article having excellent properties such as a strength or an easiness of shaping can be prepared by mixing the inorganic material-based gel fine fibers and the sprayed fibers and/or powder material, or integrating the inorganic material-based gel fine fibers and the component carrier.

In the manufacturing process according to the present invention, the drying step (3) is then carried out after the collecting step (2). That is, the inorganic material-based gel fine fibers collected in the above collecting step (2) are dried to produce the inorganic material-based article containing inorganic material-based dried gel fine fibers.

In the manufacturing process according to the present invention, the drying step (3) is carried out after the collecting step (2), and then the sintering step (4) is carried out. That is, the inorganic material-based gel fine fibers collected in the above collecting step (2) are dried to produce the inorganic material-based article containing inorganic material-based dried gel fine fibers, and subsequently, the inorganic material-based article containing inorganic material-based dried gel fine fibers is sintered to produce inorganic material-based article containing inorganic material-based sintered fine fibers.

Alternatively, in the manufacturing process according to the present invention, the sintering step (4) is carried out after the collecting step (2), without carrying out the drying step (3). That is, the inorganic material-based gel fine fibers collected in the above collecting step (2) are sintered to produce the inorganic material-based article containing inorganic material-based sintered fine fibers.

Therefore, there are two kinds of the inorganic material-based article obtained by the manufacturing process according to the present invention, that is, the article containing the inorganic material-based dried gel fine fibers or the article containing the inorganic material-based sintered fine fibers.

The drying step (3) will be described at first.

When the inorganic material-based gel fine fibers collected in the collecting step (2) is dried to produce the inorganic material-based article containing the inorganic material-based dried gel fine fibers, a drying temperature may vary with the inorganic component in the inorganic material-based gel fine fibers, and is not particularly limited, but is preferably a temperature below a decomposition temperature of the organic components, for example about 200° C. or less. The drying step (3) may be carried out by heating in an oven or the like, freeze-drying or supercritical drying.

In the drying step (3), the inorganic material-based gel fine fibers are dried so that the inorganic material-based article having a strength appropriate to its application can be obtained. The inorganic material-based gel fine fibers are bonded to each other by entanglement or by adhesion caused by the evaporation of the solvents.

In the drying step (3), the inorganic material-based gel fine fibers are dried under the integrated condition with the support to obtain the inorganic material-based article containing the inorganic material-based dried gel fine fibers integrated with the support; or the inorganic material-based gel fine fibers are dried on the support, and the inorganic material-based dried gel fine fibers are separated from the support to obtain the inorganic material-based article consisting essentially of the inorganic material-based dried gel fine fibers. In both cases, the constituent fibers are bonded to each other without an adhesive, and the fibers are hardly dropped from the article.

In the manufacturing process according to the present invention, the sintering step (4) may be carried out after the collecting step (2), without carrying out the drying step (3). A sintering temperature may vary with the inorganic component in the inorganic material-based gel fine fibers, and is not particularly limited. For example, when the inorganic material-based article containing inorganic components and organic components is sintered in a range from about 200° C. or more to a temperature below a decomposition temperature of the organic components, the inorganic material-based article containing remained organic components can be obtained, and thus, the resulting inorganic material-based article can exhibit functions of the remained organic components, such as improved adherence, pliability, adjusted rigidity, an optical function by a dyestuff, or water repellency. In the inorganic material-based article obtained by sintering as above, the fibers are bonded by sintering to each other, and hardly dropped from the article. Further, when the inorganic material-based article containing inorganic material-based dried gel fine fibers is sintered over a decomposition temperature of the organic components, the inorganic material-based article consisting essentially of the inorganic components and having excellent strength and heat resistance can be obtained.

More particularly, when the inorganic material-based gel fine fibers composed of silica components containing organic components is sintered at about 200 to 400° C., the silica sintered article containing remained organic components can be obtained, and thus, the resulting inorganic material-based article can exhibit functions of the remained organic components, such as improved adherence, pliability, adjusted rigidity, an optical function by a dyestuff, or water repellency. When the inorganic material-based gel fine fibers are sintered at 800° C. or more, the silica sintered article consisting essentially of the inorganic components can be obtained. It is preferable that the inorganic material-based gel fine fibers are sintered by gradually elevating temperature, because some inorganic material-based gel fine fibers may be suddenly shrunk and damaged, when the inorganic material-based gel fine fibers are sintered at a sintered temperature without a gradual elevation of the temperature.

In the manufacturing process according to the present invention, it is possible to carry out the drying step (3) and then the sintering step (4) after the collecting step (2). In this case, the procedure to obtain the inorganic material-based article containing the inorganic material-based dried gel fine fibers in the first drying step (3) may be carried out as the drying step (3) singly carried out as mentioned above. Further, the procedure to obtain the inorganic material-based article containing the inorganic material-based sintered fine fibers in the second sintering step (4) may be carried out as the sintering step (4) singly carried out as mentioned above. In the second sintering step (4) carried out after the first drying step (3), the inorganic material-based article containing the inorganic material-based dried gel fine fibers is treated. Therefore, it is not necessary to gradually elevate the temperature. By successively carrying out the drying step (3) and the sintering step (4), the inorganic material-based article containing the inorganic material-based sintered fine fibers having the remained organic components, or the inorganic material-based article consisting essentially of the inorganic components and having an excellent strength and heat resistance can be obtained.

The inorganic material-based dried fine fibers or the inorganic material-based sintered fine fibers obtained by the manufacturing process according to the present invention may contain inorganic or organic fine particles therein. The fine particles may be produced during forming the sol solution by hydrolysis, or mixed before extruding the sol solution from the nozzle.

The fine particle may be, for example, an inorganic fine particle, such as titanium dioxide, manganese dioxide, copper oxide, silicon dioxide, activated carbon, or a metal such as platinum, or an organic fine particle, such as a colorant, or a pigment. An average particle size of the fine particle is not particularly limited, but is preferably 0.001 to 1 $\mu$m, more preferably 0.002 to 0.1 $\mu$m. An optical function, porosity, a catalyst function, an adsorption function, or an ion-exchange function can be imparted by adding the fine particles.

Figure 1:
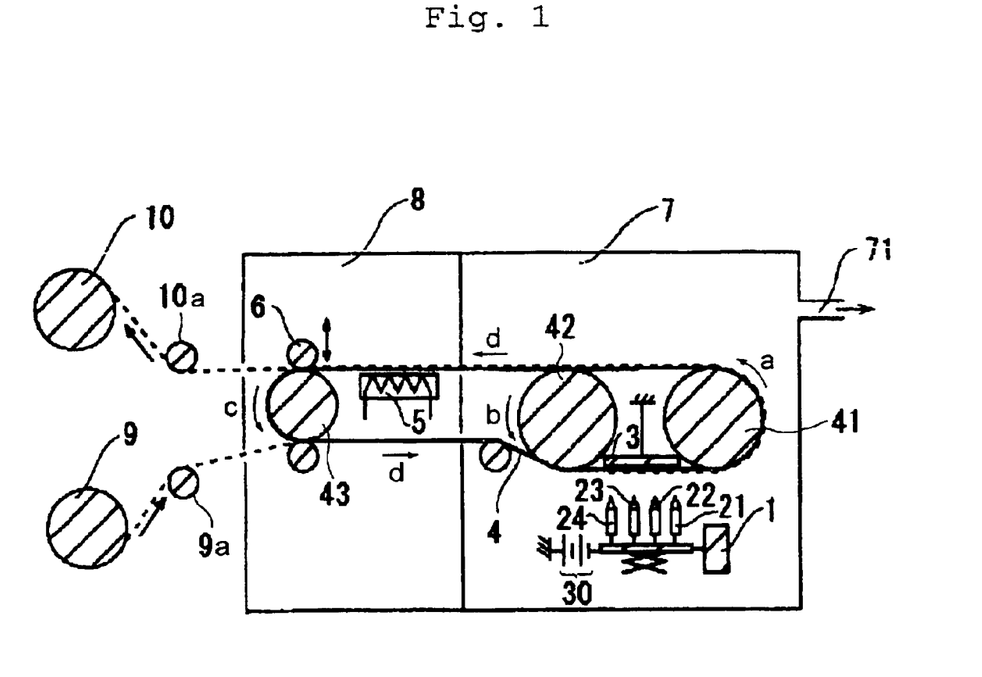
FIG. 1 schematically illustrates an embodiment of the process for manufacturing an inorganic material-based article of the present invention.

The manufacturing process according to the present invention will be explained, referring to FIG. 1 which is a sectional view schematically illustrating the manufacturing apparatus.

The sol solution prepared as mentioned above is supplied from the sol solution tank 1 to metallic nozzles 21 to 24 by a constant delivery pump or the like. An amount supplied to the nozzles 21 to 24 is not particularly limited, but for example, may vary from 0.01 to 100 mL/h per a nozzle. Although the embodiment as shown in FIG. 1 has four nozzles, the number of nozzle is not particularly limited, that is, one or more.

The sol solution supplied to the nozzles 21 to 24 is extruded therefrom. Further, a voltage is applied to the nozzles 21 to 24. More particularly, the opposite electrode 3 located on the reverse side of the support 4 with respect to the side of the nozzles 21 to 24 is grounded, an electric field is formed between the support 4 and the metallic nozzles 21 to 24 connected to the source 30. The extruded sol solution is stretched and thinned by the electric field to form the inorganic material-based gel fine fibers. A distance between the nozzles 21 to 24 and the support 4 may be changed in a range preferably from about 10 mm to about 500 mm, more preferably from about 50 mm to about 300 mm so as to adjust an electric strength from 0.5 to 5 kV/cm. Alternatively, it is possible to ground the nozzles 21 to 24 and apply a voltage to the opposite electrode 3.

When tips of the nozzles 21 to 24 are dried, the sol solution is easily cured, and thus a stable spinning becomes difficult. Therefore, it is preferable that a gas of a solvent same as or similar to that of the stock solution is provided around the tips of nozzles, or a high-boiling point solvent, such as butanol, having a boiling point of 100° C. or more is added to the sol solution, whereby the tips of the nozzles 21 to 24 are prevented from dried although not shown in FIG. 1.

The inorganic material-based gel fine fibers extruded from the nozzles 21 to 24 are collected on the support 4. The support 4 may be, for example a net endless belt, and moved in the direction of an arrow d by the roller 41, 42, 43 rotating to the directions of an arrow a, an arrow b and an allow c. An amount of the inorganic material-based gel fine fibers collected on the support may be adjusted by a moving speed of the net belt, an amount of the sol solution extruded from the nozzle, the number of the nozzles, or the like.

The inorganic material-based gel fine fibers collected on the support 4 are moved to a heating station, for example a heater 5, by the movement of the support 4, and dried by a heat of the heater 5 to obtain the inorganic material-based article containing the inorganic material-based dried gel fine fibers, i.e., a sheet containing the inorganic material-based dried gel fine fibers. It is preferable that the portion containing the heater 5 is separated as a heating room 8 from the other portions.

Then, a thickness of the inorganic material-based article (sheet) containing the inorganic material-based dried gel fine fibers is adjusted by a press roll 6, and the inorganic material-based article (sheet) containing the inorganic material-based dried gel fine fibers is separated from the support 4, and wound on a winding roll 10 via a guide roll 10a.

By the above process, the inorganic material-based article consisting essentially of the inorganic material-based dried gel fine fibers can be obtained.

Alternatively, a conjugated inorganic material-based article containing a layer of the inorganic material-based dried gel fine fibers on a woven fabric, a knitted fabric, a nonwoven fabric or a net can be obtained by supplying the woven fabric, the knitted fabric, the nonwoven fabric or the net as a support 4 from an unwind roll 9 via a guide roll 9a to the track of the roller 43, 42, 41, instead of the net endless belt support 4 used in the above-mentioned process, and moving to the station for extruding the sol solution. The resulting conjugated inorganic material-based article is wound on the winding roll 10 via the guide roll 10a in the form of the integrated article after the thickness is adjusted by the press roll 6.

Further, a three-dimensional inorganic material-based article can be obtained by supplying a three-dimensional support (not shown) such as a bellows-like support prepared by bending a plane, a cylindrical support, or a bowl-like support to the station for extruding the sol solution.

It is preferable that the portion for extruding the sol solution is separated from the other portions as a spinning room 7, because the solvents in the stock solution are evaporated, and that the spinning room 7 is made of materials not influenced by the solvents. Further, the spinning room 7 is preferably equipped with an exhaust vent 71 capable of evacuating the evaporated solvents.

By installing an electric oven (not shown) or the like for the sintering treatment after the heater 5, the drying step and the sintering step can be successively carried out. Alternatively, the electric oven or the like is installed instead of the heater 5 to carry out the sintering step without the drying step.

According to the manufacturing process according to the present invention as mention above, the inorganic material-based gel tine fibers can be bonded by drying or sintering, without an adhesive, or the inorganic material-based dried gel fine fibers are bonded by sintering, without an adhesive. Therefore, the inorganic material-based article without the disadvantages caused by an adhesive may be prepared.

According to the manufacturing process according to the present invention as mention above, the inorganic material-based article containing the inorganic material-based dried gel ultra-fine fibers having a fiber diameter of 2 $\mu$m or less or the inorganic material-based sintered ultra-fine fibers having a fiber diameter of 2 $\mu$m or less can be produced by adjusting a strength of the electric field, an amount of the sol solution extruded from the nozzle, an amount of the solvents in the sol solution, or an atmosphere at the extrusion portion, more particularly, by changing the atmosphere with or without a gas of the solvents same as or similar to those of the sol solution. The resulting inorganic material-based article has excellent properties, such as a filtering performance, a pliability, or a separating performance. The present inorganic material-based article containing the inorganic material-based dried gel ultra-fine fibers having a fiber diameter of 2 $\mu$m or less or the inorganic material-based sintered ultra-fine fibers having a fiber diameter of 2 $\mu$m or less has an excellent pliability, and can be bent and/or incurvated into various shaped articles. For example, the inorganic material-based article can be wound on a hollow or solid cylinder, or bent to the bellows-like shape.

According to the manufacturing process according to the present invention as mention above, the inorganic material-based article containing the inorganic material-based dried gel fine fibers having a long fiber length in comparison with a fiber diameter or the inorganic material-based sintered fine fibers having a long fiber length in comparison with a fiber diameter, that is, the inorganic material-based article containing the inorganic material-based dried gel fine long fibers having a high aspect ratio (fiber length/fiber diameter) or the inorganic material-based sintered fine long fibers having a high aspect ratio can be produced. The inorganic material-based dried gel fine long fibers or the inorganic material-based sintered gel fine long fibers are hardly dropped from the inorganic material-based article.

According to the manufacturing process according to the present invention as mention above, the inorganic material-based article containing the inorganic material-based dried gel fine fibers or the inorganic material-based sintered fine fibers having a fiber diameter CV value (standard deviation/average fiber diameter) of 0.8 or less can be produced. The term "fiber diameter" as used herein with respect to a fiber having a circular cross-sectional shape means a diameter of the circle. For a fiber having a non-circular cross-sectional shape, a diameter of a circle having an area the same as that of the non-circular cross-sectional shape is regarded as a diameter. The term "average fiber diameter" as used herein means an average of fiber diameters of 100 fiber points, and the term "standard deviation" as used herein means a value obtained from fiber diameters of 100 fiber points. The inorganic material-based article containing inorganic material-based dried gel fine fibers or the inorganic material-based sintered fine fibers having a CV value of 0.8 or less is preferable, because it has an uniform performance. The CV value is preferably 0.7 or less, more preferably 0.6 or less, particularly preferable 0.5 or less, most preferably 0.4 or less.

The inorganic material-based article produced by the process according to the present invention may be preferably used, for example, as a filtration material for an HEPA filter, a filtration material for a ULPA filter, a filtration material for a clean room filter, a filtration material for a pure water filter, a filtration material for a heat resistant filter, a filtration material for an exhaust gas filter, a filtration material for a liquid filter, a substrate for carrying an optical catalyst, a battery separator, a substrate for a print substrate, a catalyst sheet, an electromechanical transducer element, a sheet for releasing fine bubbles, a catalyst combustion sheet, a covering material for a solar battery, a space material for liquid crystal, a heat insulating material, or the like.

The present invention also relates to the inorganic material-based article containing the inorganic material-based ultra-fine long fibers having an average fiber diameter of 2 $\mu$m or less, and composed mainly of an inorganic component. The inorganic material-based article containing the inorganic material-based ultra-fine long fibers according to the present invention can be prepared by, for example, the above-mentioned manufacturing process according to the present invention.

The inorganic material-based article containing the inorganic material-based ultra-fine long fibers having an average fiber diameter of 2 $\mu$m or less has an excellent pliability, and can exhibit various excellent functions such as a filtering performance or sufficiently exhibit functions of functional substances because of a large surface area. The average fiber diameter is preferably 1 $\mu$m or less, more preferably 0.5 $\mu$m or less. The lower limit of the average fiber diameter is not particularly limited, but is preferably about 0.01 $\mu$m.

The average fiber diameter of the inorganic material-based ultra-fine long fiber is 2 $\mu$m or less, and therefore, the inorganic material-based ultra-fine long fiber may contain a portion having a fiber diameter of more than 2 $\mu$m. However, it is preferable that any portions in the inorganic material-based ultra-fine long fiber have a fiber diamter of 2 $\mu$m or less, more preferably 1 $\mu$m or less, most preferably 0.5 $\mu$m or less.

The inorganic material-based article containing the inorganic material-based ultra-fine long fibers hardly releases the fibers, because the constituent fiber is long.

The inorganic material-based ultra-fine long fibers contained in the inorganic material-based article according to the present invention are composed mainly of inorganic components. That is, the inorganic components account for 50 mass % or more, preferably 60 mass % or more, more preferably 75 masse or more.

The elements of the inorganic components are not particularly limited, but for example, are the elements enumerated with reference to the sol solution forming step (1) of the manufacturing process of the present invention, and the compound, such as oxide, containing the elements are for example those enumerated with reference to the sol solution forming step (1) of the manufacturing process of the present invention.

The inorganic material-based ultra-fine long fibers in the inorganic material-based article of the present invention may contain organic components in addition to the inorganic components. The organic components may be those enumerated with reference to the sol solution forming step (1) of the manufacturing process of the present invention, for example, a silane coupling agent, an organic low-molecular compound such as a dyestuff, an organic high-molecular compound such as polymethyl methacrylate.

The inorganic material-based ultra-fine long fibers may contain inorganic or organic fine particles therein as mentioned with reference to the manufacturing process of the present invention. The fine particles can reside in the fibers according to a method as mentioned with reference to the manufacturing process of the present invention.

The present inorganic material-based article containing the inorganic material-based ultra-fine long fibers hardly releases fibers and has an excellent pliability, because it contains the inorganic material-based ultra-fine long fibers. An amount of the inorganic material-based ultra-fine long fibers in the present inorganic material-based article is not particularly limited, but is preferably 1 mass % or more, more preferably 5 mass % or more with respect to the whole mass of the inorganic material-based article excluding the mass of the support. In this connection, it is noted that the present inorganic material-based article may contain the powder material or the fine particles.

When the inorganic material-based ultra-fine long fibers in the present inorganic material-based article are bonded to each other at contacting surfaces without an adhesive, the inorganic material-based article according to the present invention does not substantially contain an adhesive, or thus suppresses the release of pollutants.

The inorganic material-based ultra-fine long fibers forming the present inorganic material-based article may be, for example, in the form of a dried gel, an incompletely sintered gel, or completely sintered gel.

The present inorganic material-based article may be a mixture or conjugation of the inorganic material-based ultra-fine long fibers with organic material-based fibers, inorganic material-based thick fibers having a fiber diameter of more than 2 $\mu$m, inorganic material-based short fibers, or yarns thereof, a woven fabric thereof, a knitted fabric thereof, a nonwoven fabric thereof, a net thereof, the powder material, or the like. Various properties such as a strength or an easiness of shaping may be enhanced in the present inorganic material-based article, and applied to various field, by such a mixture or conjugation.

The present inorganic material-based article has an excellent pliability, and can be of any shape, such as a sheet, a plate, a block, a hollow or solid cylinder, or the like.

The present inorganic material-based article containing the inorganic material-based ultra-fine long fibers can be prepared by, for example, the process according to the present invention. However, an amount of the sol solution extruded from the nozzle, the viscosity of the sol solution, the solvents of the sol solution, a strength of the electric field, or a selection of the compounds containing the above-mentioned elements should be appropriately adjusted so as to obtain long fibers having an average fiber diameter of 2 $\mu$m or less, when spun. The above conditions may be easily determined by repeating experiments.

In the drying step (3) of the manufacturing process of the present invention, the inorganic material-based gel fine long fibers are dried under the integrated condition with the support to obtain the inorganic material-based article containing the inorganic material-based dried gel ultra-fine long fibers integrated with the support; or the inorganic material-based gel fine long fibers are dried on the support, and the inorganic material-based dried gel ultra-fine long fibers are separated from the support to obtain the inorganic material-based article consisting essentially of the inorganic material-based dried gel ultra-fine long fibers. In both cases, the constituent fibers are bonded to each other without an adhesive, and the fibers are hardly dropped from the article.

In the manufacturing process according to the present invention, the sintering step (4) may be carried out after the collecting step (2), without carrying out the drying step (3). For example, when the inorganic material-based article containing inorganic components and organic components is sintered in a range from about 200° C. or more to a temperature below a decomposition temperature of the organic components, the inorganic material-based article containing remained organic components can be obtained, and thus, the resulting inorganic material-based article can exhibit functions of the remained organic components. In the inorganic material-based article obtained by sintering as above, the fibers are bonded by sintering to each other, and hardly dropped from the article. Further, when the inorganic material-based article containing inorganic components and organic components is sintered over a decomposition temperature of the organic components, the inorganic material-based article consisting essentially of the inorganic components and having excellent strength and heat resistance can be obtained.

In the manufacturing process according to the present invention, the inorganic material-based article containing the inorganic material-based sintered ultra-fine long fibers having the remained organic components, or the inorganic material-based article containing the inorganic material-based sintered ultra-fine long fibers consisting essentially of the inorganic components and having an excellent strength and heat resistance can be obtained, by successively carrying out the drying step (3) and the sintering step (4) after the collecting step (2).

The present inorganic material-based article containing the inorganic material-based ultra-fine long fibers having a CV value of 0.8 or less is preferable, because it has an uniform performance. The CV value is preferably 0.7 or less, more preferably 0.6 or less, particularly preferable 0.5 or less, most preferably 0.4 or less.

The present inorganic material-based article containing the inorganic material-based ultra-fine long fibers hardly releases fibers therefrom, has excellent pliability, a wide surface area, and an excellent heat resistance, and hardly release pollutants. Therefore, it may be preferably used, for example, as a filtration material for an HEPA filter, a filtration material for a ULPA filter, a filtration material for a clean room filter, a filtration material for a pure water filter, a filtration material for a heat resistant filter, a filtration material for an exhaust gas filter, a filtration material for a liquid filter, a substrate for carrying an optical catalyst, a battery separator, a substrate for a print substrate, a catalyst sheet, an electromechanical transducer element, a sheet for releasing fine bubbles, a catalyst combustion sheet, a covering material for a solar battery, a space material for liquid crystal, a heat insulating material, or the like.

The present invention also relates to a substrate for a circuit board, comprising a fiber sheet containing inorganic material-based ultra-fine fibers having an average fiber diameter of 2 μm or less, and composed mainly of an inorganic component. The substrate exhibits an excellent reliable insulation quality and a laser workability, and it sufficiently meets the requirement for the miniaturization and high performance of a circuit board.

The thinner the average fiber diameter of the inorganic material-based ultra-fine fibers for the substrate has, the more excellent laser workability the circuit board of the present invention can exhibit. The average fiber diameter is preferably 1 μm or less, more preferably 0.5 μm or less, The lower limit of the average fiber diameter of the inorganic material-based ultra-fine fibers is not particularly limited, so long as a matrix resin can be uniformly impregnated, but is preferably about 0.01 μm.

The average fiber diameter of the inorganic material-based ultra-fine fiber for the substrate is 2 μm or less, and therefore, the inorganic material-based ultra-fine fiber may contain a portion having a fiber diameter of more than 2 μm. However, it is preferable that any portions in the inorganic material-based ultra-fine fiber have a fiber diamter of 2 μm or less, more preferably 1 μm or less, most preferably 0.5 μm or less.

The inorganic material-based ultra-fine fibers for the substrate contains the inorganic components as a main component (50 mass % or more) so that it exhibits the reliable insulation quality and maintains a good dimensional stability even when heated. It is preferable that the inorganic material-based ultra-fine fibers for the substrate contains 50 mass % or more, more preferably 75 mass % or more, most preferably 99.9 mass % of silica components ($SiO_2$), in view of the dielectric characteristics of the circuit board. In particular, the inorganic material-based ultra-fine fiber containing 99.9 mass % of the silica components has a dielectric constant of 3.8, that is, a low value in comparison with other glass compositions. Therefore, it is suitable as a substrate for the circuit board meeting the high-frequency requirement.

The inorganic component other than the silica component is not particularly limited, but for example, $Al_2O_3$, $B_2O_3$, CaO, MgO, $K_2O$, $Na_2O$, $TiO_2$, $ZrO_2$, $CeO_2$, $SnO_2$, $Fe_2O_3$, $V_2O_5$, CdO, $WO_3$, $Nb_2O_5$, $Ta_2O_5$, $In_2O_3$, $GeO_2$, PbO, $PbTi_4O_9$, $LiNbO_3$, $BaTiO_3$, $PbZrO_3$, $KTaO_3$, $Li_2B_4O_7$, $NiFe_2O_4$, $SrTiO_3$. The inorganic component may be composed of one or more oxides as above. The inorganic material-based ultra-fine fibers for the substrate may have a composition from an E glass composition to Q glass (silica glass) composition by combining the above inorganic components, and may be applied to substrates having various grades.

The inorganic material-based ultra-fine fibers for the substrate may contain organic components in addition to the above-mentioned inorganic components. The organic components may be, for example, a silane coupling agent, titanium coupling agent or the like.

It is preferable that the inorganic material-based ultra-fine fibers for the substrate are long fibers. The substrate containing the inorganic material-based ultra-fine long fibers can suppress the fuzzing or the dropping of the fibers during an impregnating step of a matrix resin, a step of processing the circuit board, such as a step of producing holes or cutting the circuit board.

The substrate of the present invention comprises a fiber sheet, such as a woven fabric or a nonwoven fabric, containing the above-mentioned inorganic material-based ultra-fine fibers. The substrate preferably comprises the nonwoven fabric, in view of a smoothness of the surface and an apparent density. That is, the substrate having a nonwoven fabric structure exhibits a smoothness more excellent than the substrate having a woven fabric structure, because the former does not contain a portion where yarns are crossed to each other as in the latter. Further, an apparent density of the substrate having a nonwoven fabric structure even with fine fibers does not become too high, and an excellent permeability of a matrix resin can be obtained.

The substrate of the present invention comprises the fiber sheet containing the above-mentioned inorganic material-based ultra-fine fibers. However, the substrate may contain, in addition to the above-mentioned inorganic material-based ultra-fine fibers, organic material-based ultra-fine fibers (average fiber diameter=2 μm or less), inorganic material-based thick fibers (average fiber diameter=more than 2 μm), organic material-based thick fibers (average fiber diameter= more than 2 μm), or an adhesive. It is preferable that the fibers forming the substrate of the present invention consist essentially of the inorganic material-based ultra-fine fibers, in view of a reliable insulation quality or a laser workability. Further, it is preferable that the substrate of the present invention consists essentially of the inorganic material-based ultra-fine fibers, but does not contain an adhesive. In the substrate wherein the fibers are bonded without an adhesive at the crossing portions thereof, a poor penetration of a matrix resin caused by a formation of the adhesive resin coating can be prevented during the production of the circuit board, Further, it can prevent impurity from releasing. Therefore, the circuit board having a long-term reliable insulation quality can be produced.

The thickness of the substrate of the present invention is preferably 80 μm or less, so that the substrate can contribute the miniaturization of the circuit board. The thinner the thickness of the substrate is in a range where an insulation is insured, the smaller the circuit board becomes. The thickness of the substrate is preferably 60 μm or less, more preferably 50 μm or less. The lower limit of the thickness of the substrate is not particularly limited, so long as the substrate has a strength capable of withstanding an impregnation process with a matrix resin, but is suitably about 10 μm. The term "thickness" as used herein means a value determined by a method defined in JIS B 7502, that is, a value measured by an outside micrometer under 5N load.

A mass per unit area and an apparent density of the substrate of the present invention are not particularly limited, but a mass per unit is preferably 3 to 30 g/m², because an excellent mechanical strength can be obtained, and an apparent density is preferably 0.05 to 0.5g/cm³. The mass per unit area means a basis weight measured by a method defined in JIS P 8124, a method for measuring a basis weight of paper and board, and the apparent density is a value obtained by dividing the basis weight by the thickness.

The substrate of the present invention may be prepared by, for example, the following process comprising the steps of (1) forming a sol solution mainly composed of an inorganic component [the sol solution forming step as above],
(2) producing inorganic material-based gel ultra-fine long fibers by extruding the resulting sol solution from a nozzle, and at the same time, applying an electrical field to the extruded sol solution to thin the extruded sol solution, and then, collecting inorganic material-based gel ultra-fine fibers on a support [the collecting step as above], and then,
(3) drying or drying and sintering the collected inorganic material-based gel ultra-fine long fibers to produce the fiber sheet containing inorganic material-based ultra-fine long fibers [the drying step as above or the sintering step as above]. According to the above-mentioned process, the nonwoven fabric substrate consisting essentially of the inorganic material-based ultra-fine long fibers having an average fiber diameter of 2 µm or less, and composed mainly of an inorganic component can be prepared. That is, the nonwoven fabric substrate wherein the inorganic material-based ultra-fine long fibers are bonded to each other at crossing portions without an adhesive can be obtained.

The above sol solution forming step (1), the collecting step (2), the drying step (3), and the sintering step (4) can be carried out as mentioned above.

When the stock solution used in the sol solution forming step (1) comprises the oxide compound containing 50 mass % or more of silane-based compound, the inorganic material-based ultra-fine long fibers containing 50 mass % or more of silica components can be obtained. The oxide compound may contain an organic component. For example, when the silane-based compound is used as the oxide compound, the silane-based compound may be modified with an organic group, such as a methyl or epoxy group.

In the collecting step (2), the inorganic material-based gel ultra-fine short fibers may be produced by intermittently extruding the sol solution from the nozzle, and collected on the support. Further, the nozzles for extruding the inorganic material-based gel ultra-fine short fibers may be placed in juxtaposition with the nozzles for extruding the inorganic material-based gel ultra-fine long fibers so that a mixture of the inorganic material-based gel ultra-fine short fibers and the inorganic material-based gel ultra-fine long fibers can be collected on the support. While the inorganic material-based gel ultra-fine long fibers are drawn from the nozzle to the support, organic material-based ultra-fine fibers having an average diameter of 2 µm or less, inorganic material-based thick fibers having an average diameter of more than 2 µm, organic material-based thick fibers having an average diameter of more than 2 µm, or adhesives may be supplied thereto so that a mixture thereof can be collected on the support.

When the inorganic material-based dried or sintered ultra-fine long fibers having an average diameter of 2 µm or less should be obtained, the average diameter of the inorganic material-based gel fine long fibers before dried and/or sintered does not need to be 2 µm or less. For example, an average diameter of 3 µm or less is sufficient to obtain the inorganic material-based dried or sintered ultra-fine long fibers having an average diameter of 2 µm or less, because the inorganic material-based gel fine long fibers are shrunk to some degree in the drying step (3) and/or the sintering step (4).

The circuit board of the present invention may be prepared by applying a matrix resin of a thermosetting resin to the substrate of the present invention. Therefore, the circuit board of the present invention can be well treated by a laser without disadvantages that a shape of the produced hole may not be accurate, a production of holes cannot be smoothly carried out, or fiber fuzzes are released. Further, the circuit board of the present invention has an excellent reliable insulation quality.

The thermosetting resin, that is, the matrix resin, which may be used for the circuit board of the present invention is not particularly limited, but may be, for example, a phenolic resin, an epoxy resin, a polyimide resin, an isocyanate resin, an unsaturated polyester resin, or a maleimide resin. Further, a resin composition prepared by blending or reacting two or more above-mentioned resins; a modified resin prepared by modifying one or more the above-mentioned thermosetting resins with polyvinyl butyral, acrylonitrile-butadiene rubber, a polyfunctional acrylate compound, or an additive; a resin composition prepared from a cross-linking setting resin (IPN or semi-IPN) modified with a cross-linked polyethylene, a cross-linked polyethylene/epoxy resin, a cross-linked polyethylene/cyanate resin, polyphenylene/cyanate resin, or other thermosetting resin, may be also used. When the matrix resin is composed of at least one selected from a group of a phenolic resin, an epoxy resin, a polyimide resin, and an isocyanate resin, the circuit board having an excellent heat resistance can be obtained.

A prepreg may be prepared by applying the above-mentioned thermosetting resin, i.e., the matrix resin, to the substrate of the present invention. The thermosetting resin, i.e., the matrix resin, can be applied to the substrate by an impregnating method, a coating method, or a melt-transferring method. More particularly, there may be mentioned (1) a method wherein the substrate is impregnated with a vanish prepared by dissolving the thermosetting resin (the matrix resin) in a solvent, and then, dried, (2) a method wherein the substrate is impregnated with a liquid thermosetting resin (the matrix resin) prepared at a normal temperature or an elevated temperature without a solvent, (3) a method wherein powdery thermosetting resin (the matrix resin) is fixed on the substrate, (4) a method wherein a layer of a thermosetting resin (the matrix resin) is formed on a film or sheet having a release property, and then, the melted layer is transferred to the substrate, or the like.

The substrate carrying the thermosetting resin (the matrix resin) can be dried by, for example, an upright dryer located separately therefrom, to produce a prepreg.

An amount of the thermosetting resin (the matrix resin) applied to the prepreg is not particularly limited, but is preferably 30 to 95% by weight with respect to the whole weight of the prepreg. If the amount of the thermosetting resin (the matrix resin) is less than 30% by weight, defective moldings are liable to be produced. If the amount is more than 95% by weight, a molding becomes difficult.

The circuit board of the present invention may be prepared, using at least one prepreg. More specifically, the circuit board of the present invention may be a circuit board consisting of one or more prepregs as above, a circuit board prepared by combining one or more prepregs as above and one or more conventional substrates such as a glass woven fabric or a glass nonwoven fabric, a circuit board carrying a metallic foil on one or both sides of the above-mentioned circuit board, an inner layer circuit board having a printed wiring network formed on the above-mentioned circuit board for an inner layer, a multi-layered circuit board prepared from the above-mentioned circuit boards, or the like.

The metallic foil which may be used in the circuit board carrying one or two metallic foils may be a conventional foil, such as a copper foil, an iron foil, an aluminum foil, or an aluminum/copper foil. One or both sides of the foil surface may be treated. A foil having an adhesive may be used.

EXAMPLES

The present invention will now be further illustrated by, but is by no means limited to, the following Examples.

Example 1
(1) Sol Solution Forming Step

Tetraethoxysilane as a metallic compound, ethanol as a solvent, water for hydrolysis, and 1N HCl as a catalyst were mixed at a molar ratio of 1;5:2:0.03, and heated under reflux at 78° C. for 10 hours. Then, the solvent was removed by a rotary evaporator. The whole was heated at 50° C. to obtain a sol solution having a viscosity of about 20 poise.

(2) Collecting Step

The resulting sol solution was pumped to stainless steel nozzles having an inner diameter of 0.5 mm at a rate of 1.2 mL/h per a nozzle. The sol solution was extruded from the nozzles. At the same time, a voltage of 25 kV was applied to the nozzles, and a stainless steel pore-free roll as a support was grounded so that an electrical field (2.5 kV/cm) was applied to the extruded sol solution to thereby thin the diameter of the extruded sol solution, produce inorganic material-based gel fine long fibers, and collect the resulting inorganic material-based gel fine long fibers on the rotating stainless steel pore-free roll. A distance between the nozzles and the stainless steel pore-free roll was 10 cm.

(3) Drying Step

The collected inorganic material-based gel fine long fibers were dried by a heater at 150° C. to form an inorganic material-based article composed of the dried inorganic material-based gel fine long fibers made of $SiO_2$ and having an average diameter of 3 µm wherein diameters of any portions of the fibers were about 3 µm. Contacting surfaces of the dried inorganic material-based gel fine long fibers made of $SiO_2$ and forming the inorganic material-based article were bonded to each other not via an adhesive, and thus, the article will release no pollutants. Further, when the resulting inorganic material-based article was bent, no crack was formed or no fibers were dropped.

(4) Sintering Step

The resulting dried inorganic material-based gel fine long fibers were completely vitrified by sintering at 150° C. for 5 hours, at 300° C. for 5 hours, and then at 1000° C. to obtain an inorganic material-based article composed of sintered silica glass ultra-fine long fibers having an average diameter of 2 µm wherein diameters of any portions of the fibers were about 2 µm. Contacting surfaces of the sintered silica glass ultra-fine long fibers forming the inorganic material-based article were bonded to each other not via an adhesive, and thus, the article will release no pollutants. Further, when the resulting inorganic material-based article was bent, no crack was formed or no fibers were dropped.

Example 2

The procedures described in Example 1 (1) to (3) were repeated, except that a sol solution having a viscosity of about 10 poise was used, to obtain an inorganic material-based article composed of the dried inorganic material-based gel ultra-fine long fibers made of $SiO_2$ and having an average diameter of 1 µm wherein diameters of any portions of the fibers were about 1 µm. Contacting surfaces of the dried inorganic material-based gel ultra-fine long fibers made of $SiO_2$ and forming the inorganic material-based article were bonded to each other not via an adhesive, and thus, the article will release no pollutants. Further, when the resulting inorganic material-based article was bent, no crack was formed or no fibers were dropped.

Then, the inorganic material-based article composed of the dried inorganic material-based gel ultra-fine long fibers was sintered and completely vitrified as in Example 1 (4), to obtain an inorganic material-based article composed of sintered silica glass ultra-fine long fibers having an average diameter of 0.8 µm wherein diameters of any portions of the fibers were about 0.8 µm. Contacting surfaces of the sintered silica glass ultra-fine long fibers forming the inorganic material-based article were bonded to each other not via an adhesive, and thus, the article will release no pollutants. Further, when the resulting inorganic material-based article was bent, no crack was formed or no fibers were dropped.

Example 3

The procedures described in Example 1 (1) to (3) were repeated, except that a sol solution prepared by adding butanol to adjust a viscosity to about 3.5 poise was used, a rate of the sol solution pumped to nozzles was 0.8 mL/h per a nozzle, and the voltage applied to nozzles was 20 kV, to obtain an inorganic material-based article composed of the dried inorganic material-based gel ultra-fine long fibers made of $SiO_2$ and having an average diameter of 0.6 µm wherein diameters of any portions of the fibers were about 0.6 µm. Contacting surfaces of the dried inorganic material-based gel ultra-fine long fibers made of $SiO_2$ and forming the inorganic material-based article were bonded to each other not via an adhesive, and thus, the article will release no pollutants. Further, when the resulting inorganic material-based article was bent, no crack was formed or no fibers were dropped.

Then, the inorganic material-based article composed of the dried inorganic material-based gel ultra-fine long fibers was sintered and completely vitrified as in Example 1 (4), to obtain an inorganic material-based article composed of sintered silica glass ultra-fine long fibers having an average diameter of 0.4 µm wherein diameters of any portions of the fibers were about 0.4 µm. Contacting surfaces of the sintered silica glass ultra-fine long fibers forming the inorganic material-based article were bonded to each other not via an adhesive, and thus, the article will release no pollutants, Further, when the resulting inorganic material-based article was bent, no crack was formed or no fibers were dropped.

Example 4

The procedures described in Example 1 (1) to (3) were repeated, except that a sol solution prepared by adding butanol to adjust a viscosity to about 1.5 poise was used, a rate of the sol solution pumped to nozzles was 0.6 mL/h per a nozzle, and the voltage applied to nozzles was 20 kV, to obtain an inorganic material-based dried gel article, i.e., an inorganic material-based dried gel nonwoven fabric, composed of the inorganic material-based ultra-fine long fibers made of $SiO_2$ and having an average diameter of 0.2 µm wherein diameters of any portions of the fibers were about 0.2 µm. Contacting surfaces of the inorganic material-based ultra-fine long fibers made of $SiO_2$ and forming the inorganic material-based dried gel article, i.e., the inorganic material-based dried gel nonwoven fabric, were bonded to each other not via an adhesive, and thus, the article will release no pollutants. Further, when the resulting inorganic material-based dried gel nonwoven fabric was bent, no crack was formed or no fibers were dropped.

Then, the inorganic material-based dried gel article i.e., the inorganic material-based dried gel nonwoven fabric, was sintered at 150° C. for 5 hours, at 300° C. for 5 hours, and at 800° C. and completely vitrified to obtain an inorganic material-based sintered article i.e., an inorganic material-based sintered nonwoven fabric, composed of inorganic material-based ultra-fine long fibers, i.e., silica glass ultra-fine long fibers, having an average diameter of 0.15 μm wherein diameters of any portions of the fibers were about 0.15 μm. Contacting surfaces of the inorganic material-based ultra-fine long fibers, i.e., the silica glass ultra-fine long fibers were bonded to each other not via an adhesive, and thus, the article will release no pollutants. Further, when the resulting inorganic material-based sintered nonwoven fabric was bent, no crack was formed or no fibers were dropped.

Example 5

(1) Sol Solution Forming Step

Tetraethoxysilane as a metallic compound, ethanol as a solvent, water for hydrolysis, and 1N HCl as a catalyst were mixed at a molar ratio of 1:5:2:0.003, and heated under reflux at 78° C. for 15 hours. Then, the solvent was removed by a rotary evaporator. The whole was heated at 60° C. to obtain a sol solution having a viscosity of about 2 poise.

(2) Collecting Step

The resulting sol solution was pumped to stainless steel nozzles having an inner diameter of 0.7 mm at a rate of 1 mL/h per a nozzle. The sol solution was extruded from the nozzles. At the same time, a voltage of 16.5 kV was applied to the nozzles, and a stainless steel pore-free roll as a support was grounded so that an electrical field (1.65 kV/cm) was applied to the extruded sol solution to thereby thin the diameter of the extruded sol solution, produce inorganic material-based gel ultra-fine long fibers, and collect the resulting inorganic material-based gel ultra-fine long fibers on the rotating stainless steel pore-free roll. A distance between the nozzles and the stainless steel pore-free roll was 10 cm.

(3) Drying Step

The collected inorganic material-based gel ultra-fine long fibers were dried by a heater at 150° C. for 1 hour to form an inorganic material-based article composed of the inorganic material-based dried gel ultra-fine long fibers. Contacting surfaces of the inorganic material-based dried gel ultra-fine long fibers made of $SiO_2$ and forming the inorganic material-based article were bonded to each other not via an adhesive, and thus, the article will release no pollutants.

(4) Sintering Step

The resulting inorganic material-based article composed of the inorganic material-based dried gel ultra-fine long fibers were completely vitrified by sintering at 800° C. for 1 hour to obtain an inorganic material-based article composed of sintered silica glass ultra-fine long fibers having an average diameter of 0.6 μm wherein diameters of any portions of the fibers were about 0.6 μm. The CV value was 0.4. Contacting surfaces of the sintered silica glass ultra-fine long fibers forming the inorganic material-based article were bonded to each other not via an adhesive, and thus, the article will release no pollutants. Further, when the resulting inorganic material-based sintered article was bent, no crack was formed or no fibers were dropped.

Example 6

(1) Sol Solution Forming Step

Tetraethoxysilane as a metallic compound, ethanol as a solvent, water for hydrolysis, and 1N HCl as a catalyst were mixed at a molar ratio of 1:5:2.5:0.003, and heated under reflux at 78° C. for 15 hours. Then, the solvent was removed by a rotary evaporator. The whole was heated at 60° C. to obtain a sol solution having a viscosity of about 2.5 poise.

(2) Collecting Step

The resulting sol solution was pumped to stainless steel nozzles having an inner diameter of 0.7 mm at a rate of 1 mL/h per a nozzle. The sol solution was extruded from the nozzles. At the same time, a voltage of 17.5 kV was applied to the nozzles, and a stainless steel pore-free roll as a support was grounded so that an electrical field (1.75 kV/cm) was applied to the extruded sol solution to thereby thin the diameter of the extruded sol solution, produce inorganic material-based gel ultra-fine long fibers, and collect the resulting inorganic material-based gel ultra-fine long fibers on the rotating stainless steel pore-free roll. A distance between the nozzles and the stainless steel pore-free roll was 10 cm.

(3) Drying Step

The collected inorganic material-based gel ultra-fine long fibers were dried by a heater at 150° C. for 1 hour to form an inorganic material-based article composed of the inorganic material-based dried gel ultra-fine long fibers. Contacting surfaces of the inorganic material-based dried gel ultra-fine long fibers made of $SiO_2$ and forming the inorganic material-based article were bonded to each other not via an adhesive, and thus, the article will release no pollutants. Further, when the resulting inorganic material-based dried gel article was bent, no crack was formed or no fibers were dropped.

(4) Sintering Step

The resulting inorganic material-based article composed of the inorganic material-based dried gel ultra-fine long fibers were completely vitrified by sintering at 800 T for 1 hours to obtain an inorganic material-based article composed of sintered silica glass ultra-fine long fibers having an average diameter of 0.5 μm wherein diameters of any portions of the fibers were about 0.5 μm. The CV value was 0.4. Contacting surfaces of the sintered silica glass ultra-fine long fibers forming the inorganic material-based article were bonded to each other not via an adhesive, and thus, the article will release no pollutants. Further, when the resulting inorganic material-based sintered article was bent, no crack was formed or no fibers were dropped.

Example 7

(1) Sol Solution Forming Step

Tetraethoxysilane as a metallic compound, ethanol as a solvent, water for hydrolysis, and 1N HCl as a catalyst were mixed at a molar ratio of 1:5;3:0.003, and heated under reflux at 78° C. for 15 hours. Then, the solvent was removed by a rotary evaporator. The whole was heated at 60° C. to obtain a sol solution having a viscosity of about 3 poise.

(2) Collecting Step

The resulting sol solution was pumped to stainless steel nozzles having an inner diameter of 0.7 mm at a rate of 1 mL/h per a nozzle. The sol solution was extruded from the nozzles. At the same time, a voltage of 20 kV was applied to the nozzles, and a stainless steel pore-free roll as a support was grounded so that an electrical field (2 kV/cm) was applied to the extruded sol solution to thereby thin the diameter of the extruded sol solution, produce inorganic material-based gel ultra-fine long fibers, and collect the resulting inorganic material-based gel ultra-fine long fibers on the rotating stainless steel pore-free roll. A distance between the nozzles and the stainless steel pore-free roll was 10 cm.

(3) Drying Step

The collected inorganic material-based gel ultra-fine long fibers were dried by a heater at 150° C. for 1 hour to form an inorganic material-based article composed of the inorganic material-based dried gel ultra-fine long fibers. Contacting surfaces of the inorganic material-based dried gel ultra-fine long fibers made of $SiO_2$ and forming the inorganic material-based article were bonded to each other not via an adhesive, and thus, the article will release no pollutants. Further, when the resulting inorganic material-based dried gel article was bent, no crack was formed or no fibers were dropped.

(4) Sintering Step

The resulting inorganic material-based article composed of the inorganic material-based dried gel ultra-fine long fibers were completely vitrified by sintering at 800° C. for 1 hour to obtain an inorganic material-based article composed of sintered silica glass ultra-fine long fibers having an average diameter of 0.6 µm wherein diameters of any portions of the fibers were about 0.6 µm. The CV value was 0.3. Contacting surfaces of the sintered silica glass ultra-fine long fibers forming the inorganic material-based article were bonded to each other not via an adhesive, and thus, the article will release no pollutants. Further, when the resulting inorganic material-based sintered article was bent, no crack was formed or no fibers were dropped.

Example 8

(1) Sol Solution Forming Step

Tetraethoxysilane as a metallic compound, ethanol as a solvent, water for hydrolysis, and 1N HCl as a catalyst were mixed at a molar ratio of 1:5:2:0.003, and heated under reflux at 78° C. for 15 hours to prepare a silica stock solution.

On the other hand, 2-propyl alcohol, aluminium secbutoxide, and ethyl acetoacetate were mixed at a molar ratio of 0.4:0.08:0.08, and heated under reflux at 78° C. for 2 hours to prepare an alumina stock solution.

The resulting silica stock solution and the alumina stock solution were mixed at 78° C. for 2 hours. Then, the solvent was removed by a rotary evaporator, The whole was heated at 60° C. to obtain a sol solution having a viscosity of about 2 poise.

(2) Collecting Step

The resulting sol solution was pumped to stainless steel nozzles having an inner diameter of 0.7 mm at a rate of 1 mL/h per a nozzle. The sol solution was extruded from the nozzles. At the same time, a voltage of 24 kV was applied to the nozzles, and a stainless steel pore-free roll as a support was grounded so that an electrical field (2.4 kV/cm) was applied to the extruded sol solution to thereby thin the diameter of the extruded sol solution, produce inorganic material-based gel ultra-fine long fibers, and collect the resulting inorganic material-based gel ultra-fine long fibers on the rotating stainless steel pore-free roll. A distance between the nozzles and the stainless steel pore-free roll was 10 cm.

(3) Drying Step

The collected inorganic material-based gel ultra-fine long fibers were dried by a heater at 150° C. for 1 hour to form an inorganic material-based article composed of the silica-alumina inorganic material-based dried gel ultra-fine long fibers. Contacting surfaces of the silica-alumina inorganic material-based dried gel ultra-fine long fibers forming the inorganic material-based article were bonded to each other not via an adhesive, and thus, the article will release no pollutants.

(4) Sintering Step

The resulting inorganic material-based article composed of the inorganic material-based dried gel ultra-fine long fibers were completely vitrified by sintering at 1000° C. for 1 hour to obtain an inorganic material-based article composed of sintered silica-alumina ultra-fine long fibers having an average diameter of 0.5 µm wherein diameters of any portions of the fibers were about 0.5 µm. The CV value was 0.22. Contacting surfaces of the sintered silica-alumina ultra-fine long fibers forming the inorganic material-based article were bonded to each other not via an adhesive, and thus, the article will release no pollutants.

Example 9

(1) Sol Solution Forming Step

Tetraethoxysilane and methyltriethoxy silane as a metallic compound, ethanol as a solvent, water for hydrolysis, and 1N HCl as a catalyst were mixed at a molar ratio of 0.75:0.25:5:2:0.003, and heated under reflux at 78° C. for 15 hours, Then, the solvent was removed by a rotary evaporator. The whole was heated at 60° C. to obtain a sol solution having a viscosity of about 2 poise.

(2) Collecting Step

The resulting sol solution was pumped to stainless steel nozzles having an inner diameter of 0.7 mm at a rate of 1 mL/h per a nozzle. The sol solution was extruded from the nozzles, At the same time, a voltage of 17 kV was applied to the nozzles, and a stainless steel pore-free roll as a support was grounded so that an electrical field (1.7 kV/cm) was applied to the extruded sol solution to thereby thin the diameter of the extruded sol solution, produce organic-inorganic (silica)-hybrid material-based gel ultra-fine long fibers, and collect the resulting organic-inorganic-hybrid material-based gel ultra-fine long fibers on the rotating stainless steel pore-free roll. A distance between the nozzles and the stainless steel pore-free roll was 10 cm.

(3) Drying Step

The collected organic-inorganic-hybrid material-based gel ultra-fine long fibers were dried by a heater at 150° C. for 1 hour to form an organic-inorganic-hybrid material-based article composed of the organic-inorganic-hybrid material-based dried gel ultra-fine long fibers. Contacting surfaces of the organic-inorganic-hybrid material-based dried gel ultra-fine long fibers forming the organic-inorganic-hybrid material-based article were bonded to each other not via an adhesive, and thus, the article will release no pollutants.

(4) Sintering Step

The resulting organic-inorganic-hybrid material-based article composed of the organic-inorganic-hybrid material-based dried gel ultra-fine long fibers were completely vitrified by sintering at 500° C. for 1 hour to obtain an organic-inorganic-hybrid material-based article composed of sintered organic-inorganic-hybrid ultra-fine long fibers having an average diameter of 0.5 µm wherein diameters of any portions of the fibers were about 0.5 µm. The CV value was 0.4. Contacting surfaces of the sintered organic-inorganic-hybrid ultra-fine long fibers forming the organic-inorganic-hybrid material-based article were bonded to each other not via an adhesive, and thus, the article will release no pollutants.

Example 10

(1) Sol Solution Forming Step

Tetraethoxysilane and methyltriethoxy silane as a metallic compound, ethanol as a solvent, water for hydrolysis, and 1N HCl as a catalyst were mixed at a molar ratio of 0.9:0.1:5:2:0.003, and heated under reflux at 78° C. for 15 hours. Then, the solvent was removed by a rotary evaporator. The whole was heated at 60° C. to obtain a sol solution having a viscosity of about 2 poise.

(2) Collecting Step

The resulting sol solution was pumped to stainless steel nozzles having an inner diameter of 0.7 mm at a rate of 1 mL/h per a nozzle. The sol solution was extruded from the nozzles. At the same time, a voltage of 17 kV was applied to the nozzles, and a stainless steel pore-free roll as a support was grounded so that an electrical field (1.7 kV/cm) was applied to the extruded sol solution to thereby thin the diameter of the extruded sol solution, produce organic-inorganic (silica)-hybrid material-based gel ultra-fine long fibers, and collect the resulting organic-inorganic-hybrid material-based gel ultra-fine long fibers on the rotating stainless steel pore-free roll. A distance between the nozzles and the stainless steel pore-free roll was 10 cm.

(3) Drying Step

The collected organic-inorganic-hybrid material-based gel ultra-fine long fibers were dried by a heater at 150° C. for 1 hour to form an organic-inorganic-hybrid material-based article composed of the organic-inorganic-hybrid material-based dried gel ultra-fine long fibers. Contacting surfaces of the organic-inorganic-hybrid material-based dried gel ultra-fine long fibers forming the organic-inorganic-hybrid material-based article were bonded to each other not via an adhesive, and thus, the article will release no pollutants.

(4) Sintering Step

The resulting organic-inorganic-hybrid material-based article composed of the organic-inorganic-hybrid material-based dried gel ultra-tine long fibers were completely vitrified by sintering at 500° C. for 1 hour to obtain an organic-inorganic-hybrid material-based article composed of sintered organic-inorganic-hybrid ultra-fine long fibers having an average diameter of 0.8 $\mu$m wherein diameters of any portions of the fibers were about 0.8 $\mu$m. The CV value was 0.29. Contacting surfaces of the sintered organic-inorganic-hybrid ultra-fine long fibers forming the organic-inorganic-hybrid material-based article were bonded to each other not via an adhesive, and thus, the article will release no pollutants.

Comparative Example 1

A glass nonwoven fabric (mass per unit area=10 g/m$^2$; thickness=90 $\mu$m; apparent density=0.11 g/cm$^3$; ratio of binder=15% by weight) was prepared by laying E-glass chops (average fiber diameter=5 $\mu$m; fiber length=13 mm) in accordance with a wet-laid method to obtain a web sheet, spraying an acrylic binder to the resulting web sheet, and drying and cross-linking in an oven. The CV value was 0.11. When the resulting glass nonwoven fabric was bent, many broken glass fibers were dropped. Further, when the resulting glass nonwoven fabric was heated at 400° C. for 30 minutes, a mass was reduced by 5% after heated, and a shape of the sheet was lost. The above results showed that the glass nonwoven fabric prepared in Comparative Example 1 released pollutants, and did not have heat resistant.

When the inorganic material-based sintered article prepared in Example 5 was heated at 400° C. for 30 minutes, a mass was reduced by 0.2% after heated, and a shape of the sheet was maintained. It is apparent that the sintered article prepared in Example 5 has an excellent heat resistance, and releases little pollutant.

Example 11

(1) Preparation of Substrate

Tetraethoxysilane as a metallic compound, ethanol as a solvent, water for hydrolysis, and 1N HCl as a catalyst were mixed at a molar ratio of 1:5;2;0.03, and heated under reflux at 78° C. for 10 hours. Then, the solvent was removed by a rotary evaporator. The whole was heated at 50° C. to obtain a sol solution having a viscosity of about 20 poise.

The resulting sol solution was pumped to stainless steel nozzles having an inner diameter of 0.5 mm at a rate of 1.2 mL/h per a nozzle. The sol solution was extruded from the nozzles. At the same time, a voltage of 25 kV was applied to the nozzles, and a stainless steel pore-free roll as a support was grounded so that an electrical field (2.5 kV/cm) was applied to the extruded sol solution to thereby thin the diameter of the extruded sol solution, produce inorganic material-based gel fine long fibers, and collect the resulting inorganic material-based gel fine long fibers on the rotating stainless steel pore-free roll. A distance between the nozzles and the stainless steel pore-free roll was 10 cm.

The collected inorganic material-based gel fine long fibers were completely vitrified by sintering at 150° C. for 5 hours, at 300° C. for 5 hours, and then at 1000° C. to obtain an inorganic material-based nonwoven fabric substrate consisting essentially of sintered silica glass ultra-fine long fibers having an average diameter of 2 $\mu$m wherein diameters of any portions of the fibers were about 2 $\mu$m. The resulting substrate had a mass per unit area of 9.3 g/m$^2$, a thickness of 50 $\mu$m, and an apparent density of 0.19 g/cm$^3$. Contacting surfaces of the sintered silica glass ultra-fine long fibers forming the inorganic material-based article were bonded to each other not via an adhesive.

(2) Preparation of Prepreg

The resulting substrate was used to produce a prepreg. More particularly, the substrate was impregnated with a matrix resin varnish prepared by mixing 100 parts by weight of epoxy resin (Epicoat 1001; Yuka-Shell), 4 parts by weight of dicyandiamide, and 0.5 parts by weight of benzyldimethylamine, and dried by a drier to obtain a prepreg containing 50% by weight of the resin.

(3) Preparation of Circuit Board

A circuit board was prepared by laying two copper foils (thickness=35 $\mu$m) on both sides of the prepreg prepared in the above step (2), and pressing the whole at 150° C. for 50 minutes under the pressure of 300 N/cm$^2$.

Example 12

(1) Preparation of Substrate

Tetraethoxysilane as a metallic compound, ethanol as a solvent, water for hydrolysis, and 1N HCl as a catalyst were mixed at a molar ratio of 1:5:2:0.03, and heated under reflux at 78° C. for 10 hours. Then, the solvent was removed by a rotary evaporator. The whole was heated at 50° C. to obtain a sol solution having a viscosity of about 10 poise.

Then, the procedures described in Example 11 were repeated to collect and completely vitrify the inorganic material-based gel ultra-fine long fibers, and produce a nonwoven fabric substrate consisting essentially of sintered silica glass ultra-fine long fibers having an average diameter of 0.8 $\mu$m wherein diameters of any portions of the fibers were about 0.8 $\mu$m. The resulting substrate had a mass per unit area of 9.4 g/m$^2$, a thickness of 50 $\mu$m, and an apparent density of 0.19 g/cm$^3$. Contacting surfaces of the sintered silica glass ultra-fine long fibers forming the inorganic material-based article were bonded to each other not via an adhesive.

(2) Preparation of Prepreg

The procedures described in Example 11 were repeated except that the substrate prepared in Example 12 (1) was used to obtain a prepreg containing 50% by weight of the resin.

(3) Preparation of Circuit Board

The procedures described in Example 11 were repeated except that the prepreg prepared in Example 12 (2) was used to obtain a circuit board.

Example 13
(1) Preparation of Substrate

The procedures described in Example 12 were repeated, except that a sol solution prepared by adding butanol to the sol solution prepared in Example 12 to adjust a viscosity to about 3.5 poise was used, a rate of the sol solution pumped to nozzles was 0.8 mL/h per a nozzle, and the voltage applied to nozzles was 20 kV to obtain produce a nonwoven fabric substrate consisting essentially of sintered silica glass ultra-fine long fibers having an average diameter of 0.4 μm wherein diameters of any portions of the fibers were about 0.4 μm. The resulting substrate had a mass per unit area of 9.5 g/m$^2$, a thickness of 50 μm, and an apparent density of 0.19 g/cm$^3$. Contacting surfaces of the sintered silica glass ultra-fine long fibers were bonded to each other not via an adhesive.

(2) Preparation of Prepreg

The procedures described in Example 11 were repeated except that the substrate prepared in Example 13 (1) was used to obtain a prepreg containing 50% by weight of the resin.

(3) Preparation of Circuit Board

The procedures described in Example 11 were repeated except that the prepreg prepared in Example 13 (2) was used to obtain a circuit board.

Example 14
(1) Preparation of Substrate

The procedures described in Example 12 were repeated, except that a sol solution prepared by adding butanol to the sol solution prepared in Example 12 to adjust a viscosity to about 1.5 poise was used, a rate of the sol solution pumped to nozzles was 0.6 mL/h per a nozzle, and the voltage applied to nozzles was 20 kV to obtain produce a nonwoven fabric substrate consisting essentially of sintered silica glass ultra-fine long fibers having an average diameter of 0.15 μm wherein diameters of any portions of the fibers were about 0.15 μm. The resulting substrate had a mass per unit area of 9.7 g/m$^2$, a thickness of 50 μm, and an apparent density of 0.19 g/cm$^3$. Contacting surfaces of the sintered silica glass ultra-fine long fibers forming the inorganic material-based article were bonded to each other not via an adhesive.

(2) Preparation of Prepreg

The procedures described in Example 11 were repeated except that the substrate prepared in Example 14 (1) was used to obtain a prepreg containing 50% by weight of the resin.

(3) Preparation of Circuit Board

The procedures described in Example 11 were repeated except that the prepreg prepared in Example 14 (2) was used to obtain a circuit board.

Comparative Example 2
(1) Preparation of Substrate

The procedures described in Example 11 were repeated, except that a sol solution prepared by adjusting a viscosity of the sol solution prepared in Example 11 to about 40 poise was used, and a rate of the sol solution pumped to nozzles was 1.5 mL/h per a nozzle, to obtain a nonwoven fabric substrate consisting essentially of sintered silica glass fine long fibers having an average diameter of 3 μm wherein diameters of any portions of the fibers were about 3 μm. The resulting substrate had a mass per unit area of 9.7 g/m$^2$, a thickness of 50 μm, and an apparent density of 0.18 g/cm$^3$. Contacting surfaces of the sintered silica glass fine long fibers forming the inorganic material-based article were bonded to each other not via an adhesive.

(2) Preparation of Prepreg

The procedures described in Example 11 were repeated except that the substrate prepared in Comparative Example 2 (1) was used to obtain a prepreg containing 50% by weight of the resin.

(3) Preparation of Circuit Board

The procedures described in Example 11 were repeated except that the prepreg prepared in Comparative Example 2 (2) was used to obtain a circuit board.

Comparative Example 3
(1) Preparation of Substrate

A glass cloth (mass per unit area =46 g/m$^2$, thickness=60 μm; apparent density=0.77 g/m$^3$) prepared by plain-weaving E-glass filaments having an average diameter of 5 μm, and then, heat-cleaning the plain weave and treating with a silane coupling agent in accordance with a usual method was used as a substrate.

(2) Preparation of Prepreg

The procedures described in Example 11 were repeated except that the substrate prepared in Comparative Example 3 (1) was used to obtain a prepreg containing 50% by weight of the resin.

(3) Preparation of Circuit Board

The procedures described in Example 11 were repeated except that the prepreg prepared in Comparative Example 3 (2) was used to obtain a circuit board.

Comparative Example 4
(1) Preparation of Substrate

A glass nonwoven fabric (mass per unit area=10 g/m$^2$; thickness=90 μm; apparent density=0.11 g/cm$^3$; ratio of binder=15% by weight) prepared by laying E-glass chops (average fiber diameter=5 μm; fiber length=13 mm) in accordance with a wet-laid method to obtain a web sheet, spraying an acrylic binder to the resulting web sheet, and drying and cross linking in an oven was used as a substrate.

(2) Preparation of Prepreg

The procedures described in Example 11 were repeated except that the substrate prepared in Comparative Example 4 (1) was used to obtain a prepreg containing 50% by weight of the resin.

(3) Preparation of Circuit Board

The procedures described in Example 11 were repeated except that the prepreg prepared in Comparative Example 4 (2) was used to obtain a circuit board.

Evaluation of Circuit Board (1) Laser Workability

A copper foil on the surface of each circuit board was removed by etching. Then, a laser hole of 100 μm was produced by a carbon dioxide laser processor under the output condition of 35 mJ/pulse. After the processing, the resulting hole was examined by a light microscope, and a shape of the hole wall and a presence or absence of fuzzing of fibers were evaluated.

Evaluation of the shape of the hole wall:

◯ . . . Few concave-convex structure;

Δ . . . Few concave-convex structures;

X . . . Many concave-convex structures.

Evaluation of fuzzing:

◯ . . . A Few fuzzing;

Δ . . . A few fuzzings;

X . . . Many fuzzings.

(2) Heat Resistance After Boiled Against Soldering

Each circuit board was boiled in water for 3 hours, and dipped in a bath of molten solder at 260° C. for 30 seconds.

o . . . No abnormal portion on the circuit board;

X . . . Blisters or warpages were observed.

(3) Coefficient of Thermal Expansion

A coefficient of thermal expansion of each circuit board was determined at a temperature-raising rate of 10° C./m according to a TMA method.

(4) Peeling Strength of Copper Foil

A peeling strength of a copper foil was determined for each circuit board in accordance with a method of JIS C-6481.

(5) Insulation Resistance After Pressure Cooker Treatment (PCT)

A comb-like pattern (line width=50 μm; space between lines=50 μm) was formed between terminals on each circuit board. The resulting circuit board was treated at 121° C., under a pressure of 203 kPa, for 0 hour, 100 hours, and 200 hours. Thereafter, the circuit board was allowed to stand at 25° C., 60% RH, for 2 hours, and then a direct current voltage of 500 V was applied for 60 seconds. Thereafter, an insulation resistance was measured.

(6) Dielectric Characteristice

A dielectric constant and a dielectric dissipation factor were determined for each circuit board in accordance with a method of JIS C-6481.

The results are shown in Table 1.

and thus would be suitable for a circuit board in a high-frequency application.

On the contrary, the circuit boards prepared from the substrates composed of inorganic material-based fibers having an average fiber diameter of 3 to 5 μm (Comparative Examples 2 to 4) had poor laser workability, and therefore, many and remarkable concave-convex structures were observed on the hole walls, and many fuzzings were generated. Further, in the circuit board prepared from a glass nonwoven fabric substrate wherein the fibers were bonded with an adhesive at the crossing portions thereof (Comparative Example 4), impurity from the adhesive was eluted after the PCT treatment, and thus, particularly, the insulation resistance was lowered. The circuit board prepared from the substrate composed of E glass fibers (Comparative Examples 3 and 4) showed a high dielectric constant and a high dielectric dissipation factor, and therefore was not suitable for a circuit board in a high-frequency application.

According to the manufacturing process of the present invention, the inorganic material-based article can be prepared by the drying and/or sintering without an adhesive, and therefore, the disadvantages caused by the adhesive can be avoided.

TABLE 1

| | Examples | | | | Comparative Examples | | |
|---|---|---|---|---|---|---|---|
| | 11 | 12 | 13 | 14 | 2 | 3 | 4 |
| Laser workability | | | | | | | |
| Shape of hole wall | ◯ | ◯ | ◯ | ◯ | Δ | X | Δ |
| Fuzzing | Δ | ◯ | ◯ | ◯ | Δ | X | X |
| Heat resistance after boiled | ◯ | ◯ | ◯ | ◯ | ◯ | ◯ | ◯ |
| Coefficient of thermal expansion (ppm/° C.) | 10 | 8 | 8 | 7 | 12 | 18 | 23 |
| Peel strength of copper foil (N/cm$^2$) | 14 | 15 | 15 | 15 | 12 | 10 | 13 |
| Insulation resistance after PCT (Ω) | | | | | | | |
| Ordinary state | $6 \times 10^{14}$ | $7 \times 10^{14}$ | $6 \times 10^{14}$ | $8 \times 10^{14}$ | $6 \times 10^{14}$ | $7 \times 10^{14}$ | $5 \times 10^{14}$ |
| After 100 hours | $3 \times 10^{12}$ | $6 \times 10^{12}$ | $2 \times 10^{13}$ | $3 \times 10^{13}$ | $2 \times 10^{12}$ | $1 \times 10^{12}$ | $7 \times 10^{10}$ |
| After 200 hours | $2 \times 10^{11}$ | $8 \times 10^{11}$ | $6 \times 10^{12}$ | $8 \times 10^{12}$ | $8 \times 10^{10}$ | $4 \times 10^{11}$ | $<10^8$ |
| Dielectric Characteristics (1 MHz) | | | | | | | |
| Dielectric constant | 3.9 | 3.9 | 3.8 | 3.8 | 4.0 | 5.4 | 5.3 |
| Dielectric dissipation factor | $10^{-4}$ | $10^{-4}$ | $10^{-4}$ | $10^{-4}$ | $10^{-4}$ | $10^{-3}$ | $10^{-3}$ |

As apparent from the results of the laser workability in Table 1, shapes of the hole walls were good, and few fuzzing were observed in the circuit board of the present invention, because it is composed of the inorganic material-based ultra-fine fibers having an average fiber diameter of 2 μm or less. Because the substrate and the matrix resin are intimately bonded to each other in the circuit board of the present invention, a coefficient of thermal expansion was low, and an insulation resistance after PCT was good. Further, when the circuit board of the present invention was composed of silica glass ultra-fine fibers, it had a low dielectric constant and a low dielectric dissipation factor, The inorganic material-based article according to the present invention releases little fibers, has an excellent pliability, may have various shapes, can be applied to various fields, and hardly releases pollutants.

The present substrate for a circuit board is formed from the inorganic material-based ultra-fine fibers having an average fiber diameter of 2 μm or less, and composed mainly of an inorganic component, and therefore has an excellent laser workability, and an excellent reliable insulation quality.

The present substrate for a circuit board may contain the inorganic material-based ultra-fine fibers composed of 50 mass % or more of a silica component, and thus, may be applied to various applications. In particular, the substrate composed of the silica glass ultra-fine fibers has a low dielectric constant and a low dielectric dissipation factor, and can contribute to an high-frequency application.

The present substrate consisting essentially of the non-woven fabric structure has an excellently smooth surface, a low apparent density, an excellent permeability of the matrix resin although containing the inorganic material-based ultra-fine fibers. Therefore, a prepreg or a circuit board can be stably produced.

The present substrate consisting essentially of the inorganic material-based ultra-fine fibers has an excellent permeability of the matrix resin into the inside of the substrate for a circuit board, and impurities were not eluted therefrom. Therefore, a circuit board having an excellent insulating property can be produced.

The present substrate containing the inorganic material-based ultra-fine long fibers releases little fuzzing during the step of producing a circuit board. Therefore, a prepreg or a circuit board can be stably produced.

The present substrate having a thickness of as thin as 80 $\mu$m or less can contribute to the miniaturization of an electronic components.

The circuit board of the present invention prepared from the substrate as above has an excellent laser workability and reliable insulation quality.

As above, the present invention was explained with reference to particular embodiments, but modifications and improvements obvious to those skilled in the art are included in the scope of the present invention.

What is claimed is:

1. A process for manufacturing an inorganic material-based article comprising the steps of (1) forming a sol solution mainly composed of an inorganic component, (2) producing inorganic material-based gel fine fibers by extruding the resulting sol solution from a nozzle, and at the same time, applying an electrical field to the extruded sol solution to thin the extruded sol solution, and then, collecting inorganic material-based gel fine fibers on a support, and then, (3) drying the collected inorganic material-based gel fine fibers to produce inorganic material-based article containing inorganic material-based dried gel fine fibers.

2. The process according to claim 1, wherein the support has a three-dimensional structure.

3. A process for manufacturing an inorganic material-based article comprising the steps of (1) forming a sol solution mainly composed of an inorganic component, (2) producing inorganic material-based gel fine fibers by extruding the resulting sol solution from a nozzle, and at the same time, applying an electrical field to the extruded sol solution to thin the extruded sol solution, and then, collecting inorganic material-based gel fine fibers on a support, and then, (3) sintering the collected inorganic material-based gel fine fibers to produce inorganic material-based article containing inorganic material-based sintered fine fibers.

4. The process according to claim 3, wherein the support has a three-dimensional structure.

5. A process for manufacturing an inorganic material-based article comprising the steps of (1) forming a sol solution mainly composed of an inorganic component, (2) producing inorganic material-based gel fine fibers by extruding the resulting sol solution from a nozzle, and at the same time, applying an electrical field to the extruded sol solution to thin the extruded sol solution, and then, collecting inorganic material-based gel fine fibers on a support, (3) drying the collected inorganic material-based gel fine fibers to produce inorganic material-based article containing inorganic material-based dried gel fine fibers, and then, (4) sintering the inorganic material-based article containing inorganic material-based dried gel fine fibers to produce inorganic material-based article containing inorganic material-based sintered fine fibers.

6. The process according to claim 5, wherein the support has a three-dimensional structure.

* * * * *